(12) United States Patent
Yun (10) Patent No.: US 12,211,575 B2
(45) Date of Patent: Jan. 28, 2025

(54) STORAGE DEVICE EXECUTING READ RETRY OPERATION BASED ON READ RETRY SEQUENCE KEY AND OPERATING METHOD OF THE STORAGE DEVICE

(71) Applicant: SK hynix Inc., Icheon (KR)

(72) Inventor: Hong Sik Yun, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 18/472,751

(22) Filed: Sep. 22, 2023

(65) Prior Publication Data

US 2024/0379182 A1    Nov. 14, 2024

(30) Foreign Application Priority Data

May 10, 2023    (KR) .......................... 10-2023-0060590

(51) Int. Cl.
*G11C 29/44*    (2006.01)
(52) U.S. Cl.
CPC .................................... *G11C 29/44* (2013.01)
(58) Field of Classification Search
None
See application file for complete search history.

(56) References Cited

U.S. PATENT DOCUMENTS

| | | | |
|---|---|---|---|
| 9,633,740 B1* | 4/2017 | Alhussien | G11C 7/1006 |
| 10,175,892 B1* | 1/2019 | Kim | G06F 3/0653 |
| 2018/0342305 A1* | 11/2018 | Cha | G11C 13/0033 |
| 2021/0166774 A1* | 6/2021 | Cha | G11C 16/0483 |
| 2021/0173795 A1* | 6/2021 | Benisty | G06F 13/1668 |
| 2021/0255781 A1* | 8/2021 | Chae | G06F 3/0613 |
| 2021/0304837 A1* | 9/2021 | Kim | G11C 29/42 |
| 2022/0139483 A1* | 5/2022 | Park | G11C 16/26 365/185.09 |
| 2022/0326884 A1* | 10/2022 | Kang | G06F 13/28 |
| 2022/0375522 A1 | 11/2022 | Betz et al. | |

FOREIGN PATENT DOCUMENTS

KR    1020210099895 A    8/2021

OTHER PUBLICATIONS

Park et al., "Reducing Solid-State Drive Read Latency by Optimizing Read-Retry", Mar. 2021, arXiv:2104.09611v1 (Year: 2021).*

* cited by examiner

*Primary Examiner* — Daniel F. McMahon (57) ABSTRACT

A storage device may execute a read retry operation on a plurality of memory cells when a failure occurs during a read operation on the plurality of memory cells. The storage device may perform the read retry operation based on M history read biases, and determine a first sequence in which the M history read biases are applied when the read retry operation is performed, based on a read retry sequence key.

14 Claims, 9 Drawing Sheets

RR_SEQ_KEY

| 108 |
|-----|

5 HIST_RBs

| IDX | RB |
|-----|------|
| 1 | RB_1 |
| 2 | RB_2 |
| 3 | RB_3 |
| 4 | RB_4 |
| 5 | RB_5 |

| $i$ | $V_i$ | $(V_i/((M-i)!))$ | $INDEX\_SET_i$ | $E_i$ |
|---|---|---|---|---|
| 1 | 108 | $108/(4!) = 4$ | $\{1,2,3,4,5\}$ | 5 |
| 2 | $108\%(4!) = 12$ | $12/(3!) = 2$ | $\{1,2,3,4\}$ | 3 |
| 3 | $12\%(3!) = 0$ | $0/(2!) = 0$ | $\{1,2,4\}$ | 1 |
| 4 | $0\%(2!) = 0$ | $0/(1!) = 0$ | $\{2,4\}$ | 2 |
| 5 | $0\%(1!) = 0$ | $0/(0!) = 0$ | $\{4\}$ | 4 |

$SEQ\_1 : RB\_5 \rightarrow RB\_3 \rightarrow RB\_1 \rightarrow RB\_2 \rightarrow RB\_4$

SEQ_2 :
RB_1 -> RB_5 -> RB_3 -> RB_2 -> RB_4

| IDX | RB |
|---|---|
| 1 | RB_1 |
| 2 | RB_2 |
| 3 | RB_3 |
| 4 | RB_4 |
| 5 | RB_5 |

5 HIST_RBs

⇧

| $i$ | $E_j$ | $((M-i)!)*(N_j)$ | $INDEX\_SET_j$ | $V_j$ |
|---|---|---|---|---|
| 1 | 1 | 0*(4!) | {1,2,3,4,5} | 0 |
| 2 | 5 | 3*(3!) | {2,3,4,5} | 18 |
| 3 | 3 | 1*(2!) | {2,3,4} | 2 |
| 4 | 2 | 0*(1!) | {2,4} | 0 |
| 5 | 4 | 0*(0!) | {4} | 0 | new RR_SEQ_KEY : (0 + 18 + 2 + 0 + 0) = 20

FIG. 9

STORAGE DEVICE EXECUTING READ RETRY OPERATION BASED ON READ RETRY SEQUENCE KEY AND OPERATING METHOD OF THE STORAGE DEVICE

CROSS-REFERENCES TO RELATED APPLICATION

The present application claims priority under 35 U.S.C. 119 (a) to Korean patent application number 10-2023-0060590 filed in the Korean Intellectual Property Office on May 10, 2023, which is incorporated herein by reference in its entirety.

BACKGROUND

1. Technical Field

Various embodiments generally relate to a storage device that performs a read retry operation based on a read retry sequence key, and an operating method of the storage device.

2. Related Art

A storage device is a device which stores data on the basis of a request of an external device such as a computer, a mobile terminal such as a smartphone or a tablet, or any of various electronic devices.

The storage device may include a controller for controlling a memory (e.g., a volatile memory/a nonvolatile memory). The controller may receive a command from the external device, and may execute or control an operation for reading, writing, or erasing data with respect to the memory included in the storage device, on the basis of the received command.

Meanwhile, a failure may occur when the controller reads data stored in the memory. In this case, the controller may execute a read retry operation for reading the data again after changing read biases.

SUMMARY

Embodiments of the present disclosure may provide a storage device capable of reducing a storage space required for storing a sequence of read biases applied during a read retry operation, and an operating method of the storage device.

In one aspect, embodiments of the disclosure may provide a storage device including i) a memory including a plurality of memory cells, and ii) a controller configured to perform a read retry operation on the plurality of memory cells when a failure occurs during a read operation on the plurality of memory cells. The controller may perform the read retry operation on the plurality of memory cells based on M (M is a natural number greater than or equal to 2) history read biases. The controller may determine a first sequence, which is a sequence in which the M history read biases are applied when the read retry operation is performed, based on a read retry sequence key.

In another aspect, embodiments of the disclosure may provide an operating method of a storage device including i) detecting a failure that occurs during a read operation on a plurality of memory cells, ii) reading a read retry sequence key, iii) determining a first sequence, in which M (M is a natural number greater than or equal to 2) history read biases are applied when a read retry operation is performed on the plurality of memory cells, based on the read retry sequence key, and iv) performing the read retry operation according to the first sequence.

According to the embodiments of the present disclosure, it is possible to reduce the storage space required for storing the sequence of the read biases applied during the read retry operation.

DETAIL DESCRIPTION OF THE EXEMPLARY EMBODIMENTS

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily limited to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, logic, interfaces, decoders, drivers, generators and other signal generating and signal processing features may include, for example, a memory or other storage device for storing code or instructions to be executed, for example, by a computer, processor, microprocessor, controller, or other signal processing device.

Figure 1:
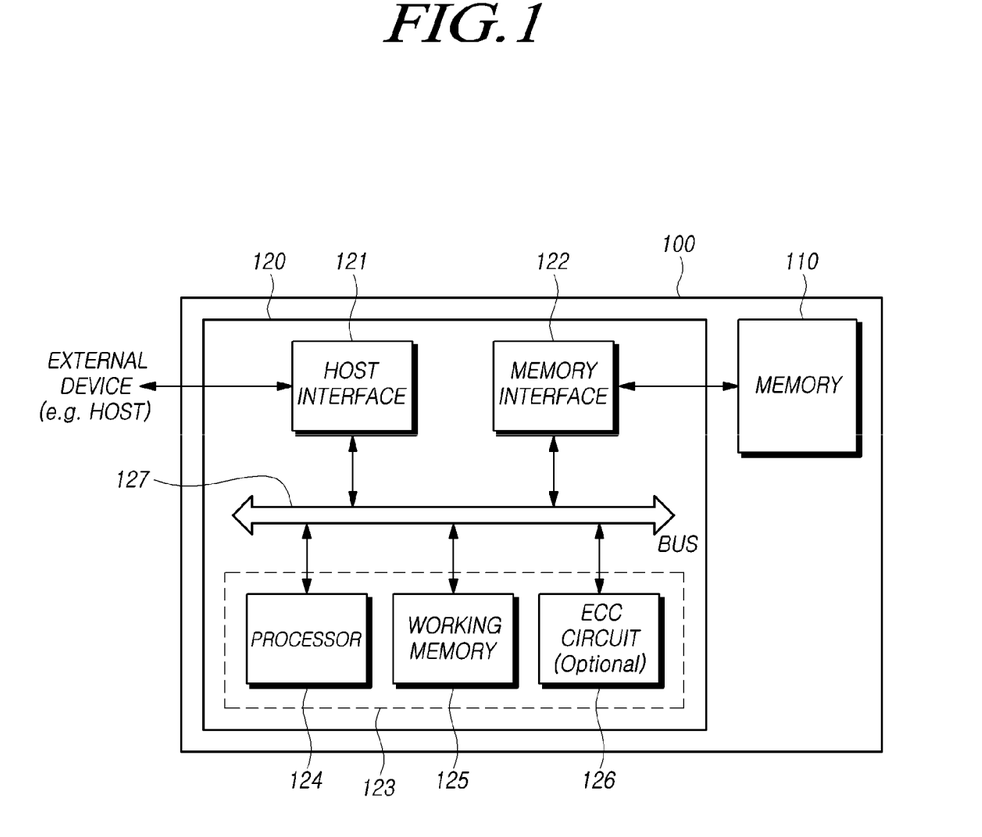
FIG. 1 illustrates a storage device according to an embodiment of the present disclosure.

FIG. 1 illustrates a storage device 100 according to an embodiment of the present disclosure.

Referring to FIG. 1, the storage device 100 may include a memory 110 that stores data and a controller 120 that controls the memory 110.

The memory 110 includes a plurality of memory blocks, and operates under the control of the controller 120. Operations of the memory 110 may include, for example, a read operation, a program operation (also referred to as a write operation), and an erase operation.

The memory 110 may include a memory cell array including a plurality of memory cells (also simply referred to as "cells") that store data. Such a memory cell array may exist in a memory block.

For example, the memory 110 may be realized in various types of memory such as a DDR SDRAM (double data rate synchronous dynamic random access memory), an LPDDR4 (low power double data rate 4) SDRAM, a GDDR (graphics double data rate) SDRAM, an LPDDR (low power DDR), an RDRAM (Rambus dynamic random access memory), a NAND flash memory, a 3D NAND flash memory, a NOR flash memory, a resistive random access memory (RRAM), a phase-change memory (PRAM), a magnetoresistive random access memory (MRAM), a ferroelectric random access memory (FRAM), and a spin transfer torque random access memory (STT-RAM).

The memory 110 may be implemented as a three-dimensional array structure. For example, embodiments of the disclosure may be applied to a charge trap flash (CTF) in which a charge storage layer is configured by a dielectric layer and a flash memory in which a charge storage layer is configured by a conductive floating gate.

The memory 110 may receive a command and an address from the controller 120 and may access an area in the memory cell array that is selected by the address. In other words, the memory 110 may perform an operation indicated by the command, on the area selected by the address.

The memory 110 may perform a program operation, a read operation or an erase operation. For example, when performing the program operation, the memory 110 may program data to the area selected by the address. When performing the read operation, the memory 110 may read data from the area selected by the address. In the erase operation, the memory 110 may erase data stored in the area selected by the address.

The controller 120 may control write (program), read, erase and background operations for the memory 110. For example, background operations may include at least one from among a garbage collection (GC) operation, a wear leveling (WL) operation, a read reclaim (RR) operation, a bad block management (BBM) operation, and so forth.

The controller 120 may control the operation of the memory 110 according to a request from a device (e.g., a host) located outside the storage device 100. The controller 120, however, also may control the operation of the memory 110 regardless or in the absence of a request of the host.

The host may be a computer, an ultra mobile PC (UMPC), a workstation, a personal digital assistant (PDA), a tablet, a mobile phone, a smartphone, an e-book, a portable multimedia player (PMP), a portable game player, a navigation device, a black box, a digital camera, a digital multimedia broadcasting (DMB) player, a smart television, a digital audio recorder, a digital audio player, a digital picture recorder, a digital picture player, a digital video recorder, a digital video player, a storage configuring a data center, one of various electronic devices configuring a home network, one of various electronic devices configuring a computer network, one of various electronic devices configuring a telematics network, an RFID (radio frequency identification) device, and a mobility device (e.g., a vehicle, a robot or a drone) capable of driving under human control or autonomous driving, as non-limiting examples. Alternatively, the host may be a virtual reality (VR) device providing 2D or 3D virtual reality images or an augmented reality (AR) device providing augmented reality images. The host may be any one of various electronic devices that require the storage device 100 capable of storing data.

The host may include at least one operating system (OS). The operating system may generally manage and control the function and operation of the host, and may provide interoperability between the host and the storage device 100. The operating system may be classified into a general operating system and a mobile operating system depending on the mobility of the host.

The controller 120 and the host may be devices that are separated from each other, or the controller 120 and the host may be integrated into one device. Hereunder, for the sake of convenience in explanation, descriptions will describe the controller 120 and the host as devices that are separated from each other.

Referring to FIG. 1, the controller 120 may include a memory interface 122 and a control circuit 123, and may further include a host interface 121.

The host interface 121 provides an interface for communication with the host. For example, the host interface 121 provides an interface that uses at least one from among various interface protocols such as a USB (universal serial bus) protocol, an MMC (multimedia card) protocol, a PCI (peripheral component interconnection) protocol, a PCI-E (PCI-express) protocol, an ATA (advanced technology attachment) protocol, a serial-ATA protocol, a parallel-ATA protocol, an SCSI (small computer system interface) protocol, an ESDI (enhanced small disk interface) protocol, an IDE (integrated drive electronics) protocol and a private protocol.

When receiving a command from the host, the control circuit 123 may receive the command through the host interface 121, and may perform an operation of processing the received command.

The memory interface 122 may be coupled with the memory 110 to provide an interface for communication with the memory 110. That is to say, the memory interface 122 may be configured to provide an interface between the memory 110 and the controller 120 under the control of the control circuit 123.

The control circuit 123 performs the general control operations of the controller 120 to control the operation of the memory 110. To this end, for instance, the control circuit 123 may include at least one of a processor 124 and a working memory 125, and may optionally include an error detection and correction circuit (ECC circuit) 126.

The processor 124 may control overall operations of the controller 120, and may perform logical calculations. The processor 124 may communicate with the host through the host interface 121, and may communicate with the memory 110 through the memory interface 122.

The processor 124 may perform the function of a flash translation layer (FTL). The processor 124 may translate a logical block address (LBA), provided by the host, into a physical block address (PBA) through the flash translation layer (FTL). The flash translation layer (FTL) may receive the logical block address (LBA) and translate the logical block address (LBA) into the physical block address (PBA), by using a mapping table.

There are various address mapping methods of the flash translation layer, depending on a mapping unit. Representative address mapping methods include a page mapping method, a block mapping method and a hybrid mapping method.

The processor 124 may randomize data received from the host. For example, the processor 124 may randomize data received from the host by using a set randomizing seed. The randomized data may be provided to the memory 110, and may be programmed to a memory cell array of the memory 110.

In a read operation, the processor 124 may derandomize data received from the memory 110. For example, the processor 124 may derandomize data received from the memory 110 by using a derandomizing seed. The derandomized data may be outputted to the host.

The processor 124 may execute firmware to control the operation of the controller 120. Namely, in order to control the overall operations of the controller 120 and perform logical calculations, the processor 124 may execute (or drive) firmware loaded in the working memory 125 upon booting. Hereafter, an operation of the storage device 100 according to embodiments of the disclosure will be described as implementing the processor 124 that executes firmware in which the corresponding operation is defined.

Firmware, as a program to be executed in the storage device 100 to drive the storage device 100, may include various functional layers. For example, the firmware may include binary data in which codes for executing the functional layers, respectively, are defined.

For example, the firmware may include at least one from among a flash translation layer (FTL), which performs a translating function between a logical address requested to the storage device 100 from the host and a physical address of the memory 110; a host interface layer (HIL), which serves to analyze a command requested to the storage device 100 as a storage device from the host and transfer the command to the flash translation layer (FTL); and a flash interface layer (FIL), which transfers a command, instructed from the flash translation layer (FTL), to the memory 110.

Such firmware may be loaded in the working memory 125 from, for example, the memory 110 or a separate nonvolatile memory (e.g., a ROM or a NOR Flash) located outside the memory 110. The processor 124 may first load all or a part of the firmware in the working memory 125 when executing a booting operation after power-on.

The processor 124 may perform logical calculations, which are defined in the firmware loaded in the working memory 125, to control the overall operations of the controller 120. The processor 124 may store a result of performing the logical calculations defined in the firmware, in the working memory 125. The processor 124 may control the controller 120 according to a result of performing the logical calculations defined in the firmware such that the controller 120 generates a command or a signal. When a part of firmware, in which logical calculation to be performed are defined, is stored in the memory 110, but not loaded in the working memory 125, the processor 124 may generate an event (e.g., an interrupt) for loading the corresponding part of the firmware into the working memory 125 from the memory 110.

The processor 124 may load metadata necessary for driving firmware from the memory 110. The metadata, as data for managing the memory 110, may include management information on user data stored in the memory 110.

Firmware may be updated while the storage device 100 is manufactured or while the storage device 100 is operating. The controller 120 may download new firmware from the outside of the storage device 100 and update existing firmware with the new firmware.

To drive the controller 120, the working memory 125 may store necessary firmware, a program code, a command and data. The working memory 125 may be a volatile memory that includes, for example, at least one from among an SRAM (static RAM), a DRAM (dynamic RAM) and an SDRAM (synchronous DRAM).

The error detection and correction circuit 126 may detect an error bit of target data, and correct the detected error bit by using an error correction code. The target data may be, for example, data stored in the working memory 125 or data read from the memory 110.

The error detection and correction circuit 126 may decode data by using an error correction code. The error detection and correction circuit 126 may be realized by various code decoders. For example, a decoder that performs unsystematic code decoding or a decoder that performs systematic code decoding may be used.

For example, the error detection and correction circuit 126 may detect an error bit by the unit of a set sector in each of the read data, when each read data is constituted by a plurality of sectors. A sector may mean a data unit that is smaller than a page, which is the read unit of a flash memory. Sectors constituting each read data may be matched with one another using an address.

The error detection and correction circuit 126 may calculate a bit error rate (BER), and may determine whether an error is correctable or not, by sector units. For example, when a bit error rate (BER) is higher than a reference value, the error detection and correction circuit 126 may determine that a corresponding sector is uncorrectable or a fail. On the other hand, when a bit error rate (BER) is lower than the reference value, the error detection and correction circuit 126 may determine that a corresponding sector is correctable or a pass.

The error detection and correction circuit 126 may perform an error detection and correction operation sequentially for all read data. In the case where a sector included in read data is correctable, the error detection and correction circuit 126 may omit an error detection and correction operation for a corresponding sector for next read data. If the error detection and correction operation for all read data is ended in this way, then the error detection and correction circuit 126 may detect a sector which is uncorrectable in read data last. There may be one or more sectors that are determined to be uncorrectable. The error detection and correction circuit 126 may transfer information (e.g., address information) regarding a sector which is determined to be uncorrectable to the processor 124.

A bus 127 may be configured to provide channels among the components 121, 122, 124, 125 and 126 of the controller 120. The bus 127 may include, for example, a control bus for transferring various control signals, commands and the like, a data bus for transferring various data, and so forth.

Some components among the above-described components 121, 122, 124, 125 and 126 of the controller 120 may be omitted, or some components among the above-described components 121, 122, 124, 125 and 126 of the controller 120 may be integrated into one component. In addition to the above-described components 121, 122, 124, 125 and 126 of the controller 120, one or more other components may be added.

Hereinbelow, the memory 110 will be described in further detail with reference to FIG. 2.

Figure 2:
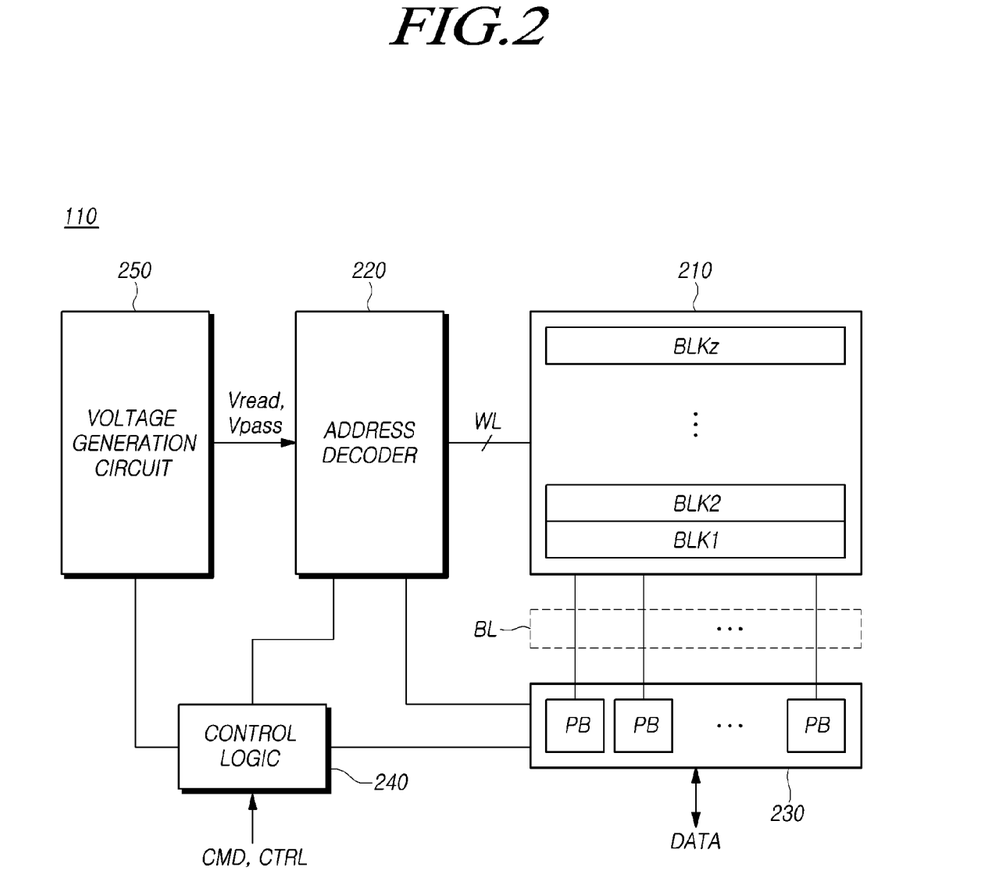
FIG. 2 illustrates a memory of FIG. 1.

FIG. 2 illustrates the memory 110 of FIG. 1.

Referring to FIG. 2, the memory 110 may include a memory cell array 210, an address decoder 220, a read and write circuit 230, a control logic 240, and a voltage generation circuit 250.

The memory cell array 210 may include a plurality of memory blocks BLK1 to BLKz (where z is a natural number of 2 or greater).

In the plurality of memory blocks BLK1 to BLKz, a plurality of word lines WL and a plurality of bit lines BL may be disposed, and a plurality of memory cells (MC) may be arranged.

The plurality of memory blocks BLK1 to BLKz may be coupled with the address decoder 220 through the plurality of word lines WL. The plurality of memory blocks BLK1 to BLKz may be coupled with the read and write circuit 230 through the plurality of bit lines BL.

Each of the plurality of memory blocks BLK1 to BLKz may include a plurality of memory cells. For example, the plurality of memory cells may be nonvolatile memory cells, and may be configured by nonvolatile memory cells that have vertical channel structures.

The memory cell array 210 may be configured by a memory cell array of a two-dimensional structure or may be configured by a memory cell array of a three-dimensional structure.

Each of the plurality of memory cells included in the memory cell array 210 may store at least 1-bit data. For instance, each of the plurality of memory cells included in the memory cell array 210 may be a signal level cell (SLC) that stores 1-bit data. In another instance, each of the plurality of memory cells included in the memory cell array 210 may be a multi-level cell (MLC) that stores 2-bit data. In still another instance, each of the plurality of memory cells included in the memory cell array 210 may be a triple level cell (TLC) that stores 3-bit data. In yet another instance, each of the plurality of memory cells included in the memory cell array 210 may be a quad level cell (QLC) that stores 4-bit data. In a further instance, the memory cell array 210 may include a plurality of memory cells, each of which stores 5 or more-bit data. The number of bits of data stored in each of the plurality of memory cells may be dynamically determined. For example, a single-level cell that stores 1-bit data may be changed to a triple-level cell that stores 3-bit data.

Referring to FIG. 2, the address decoder 220, the read and write circuit 230, the control logic 240 and the voltage generation circuit 250 may operate as a peripheral circuit that drives the memory cell array 210.

The address decoder 220 may be coupled to the memory cell array 210 through the plurality of word lines WL.

The address decoder 220 may be configured to operate in response to the control of the control logic 240.

The address decoder 220 may receive an address through an input/output buffer in the memory 110. The address decoder 220 may be configured to decode a block address in the received address. The address decoder 220 may select at least one memory block depending on the decoded block address.

The address decoder 220 may receive a read voltage Vread and a pass voltage Vpass from the voltage generation circuit 250.

The address decoder 220 may apply the read voltage Vread to a selected word line WL in a selected memory block during a read operation, and may apply the pass voltage Vpass to the remaining unselected word lines WL.

The address decoder 220 may apply a verify voltage generated in the voltage generation circuit 250 to a selected word line WL in a selected memory block in a program verify operation, and may apply the pass voltage Vpass to the remaining unselected word lines WL.

The address decoder 220 may be configured to decode a column address in the received address. The address decoder 220 may transmit the decoded column address to the read and write circuit 230.

A read operation and a program operation of the memory 110 may be performed by the unit of a page. An address received when a read operation or a program operation is requested may include at least one from among a block address, a row address and a column address.

The address decoder 220 may select one memory block and one word line depending on a block address and a row address. A column address may be decoded by the address decoder 220 and be provided to the read and write circuit 230.

The address decoder 220 may include at least one from among a block decoder, a row decoder, a column decoder and an address buffer.

The read and write circuit 230 may include a plurality of page buffers PB. The read and write circuit 230 may operate as a read circuit in a read operation of the memory cell array 210, and may operate as a write circuit in a write operation of the memory cell array 210.

The read and write circuit 230 described above may also be referred to as a page buffer circuit or a data register circuit that includes a plurality of page buffers PB. The read and write circuit 230 may include data buffers that take charge of a data processing function, and may further include cache buffers that take charge of a caching function.

The plurality of page buffers PB may be coupled to the memory cell array 210 through the plurality of bit lines BL. The plurality of page buffers PB may continuously supply sensing current to bit lines BL coupled with memory cells to sense threshold voltages (Vth) of the memory cells in a read operation and a program verify operation, and may latch sensing data by sensing, through sensing nodes, changes in the amounts of current flowing, depending on the programmed states of the corresponding memory cells.

The read and write circuit 230 may operate in response to page buffer control signals outputted from the control logic 240.

In a read operation, the read and write circuit 230 temporarily stores read data by sensing data of memory cells, and then, outputs data DATA to the input/output buffer of the memory 110. As an exemplary embodiment, the read and write circuit 230 may include a column select circuit in addition to the page buffers PB or the page registers.

The control logic 240 may be coupled with the address decoder 220, the read and write circuit 230 and the voltage generation circuit 250. The control logic 240 may receive a command CMD and a control signal CTRL through the input/output buffer of the memory 110.

The control logic 240 may be configured to control general operations of the memory 110 in response to the control signal CTRL. The control logic 240 may output control signals for adjusting the precharge potential levels of the sensing nodes of the plurality of page buffers PB.

The control logic 240 may control the read and write circuit 230 to perform a read operation of the memory cell array 210. The voltage generation circuit 250 may generate the read voltage Vread and the pass voltage Vpass used in a read operation, in response to a voltage generation circuit control signal outputted from the control logic 240.

Each memory block of the memory 110 described above may be configured by a plurality of pages corresponding to a plurality of word lines WL and a plurality of strings corresponding to a plurality of bit lines BL.

In a memory block BLK, a plurality of word lines WL and a plurality of bit lines BL may be disposed to intersect with each other. For example, each of the plurality of word lines WL may be disposed in a row direction, and each of the plurality of bit lines BL may be disposed in a column direction. In another example, each of the plurality of word lines WL may be disposed in a column direction, and each of the plurality of bit lines BL may be disposed in a row direction.

A memory cell may be coupled to one of the plurality of word lines WL and one of the plurality of bit lines BL. A transistor may be disposed in each memory cell.

For example, a transistor disposed in each memory cell (MC) may include a drain, a source and a gate. The drain (or source) of the transistor may be coupled with a corresponding bit line BL directly or via another transistor. The source (or drain) of the transistor may be coupled with a source line (which may be the ground) directly or via another transistor. The gate of the transistor may include a floating gate, which is surrounded by a dielectric, and a control gate to which a gate voltage is applied from a word line WL.

In each memory block, a first select line (also referred to as a source select line or a drain select line) may be additionally disposed outside a first outermost word line more adjacent to the read and write circuit 230 between two outermost word lines, and a second select line (also referred to as a drain select line or a source select line) may be additionally disposed outside a second outermost word line between the two outermost word lines.

At least one dummy word line may be additionally disposed between the first outermost word line and the first select line. At least one dummy word line may also be additionally disposed between the second outermost word line and the second select line.

A read operation and a program operation (write operation) of the memory block described above may be performed by the unit of a page, and an erase operation may be performed by the unit of a memory block.

Figure 3:
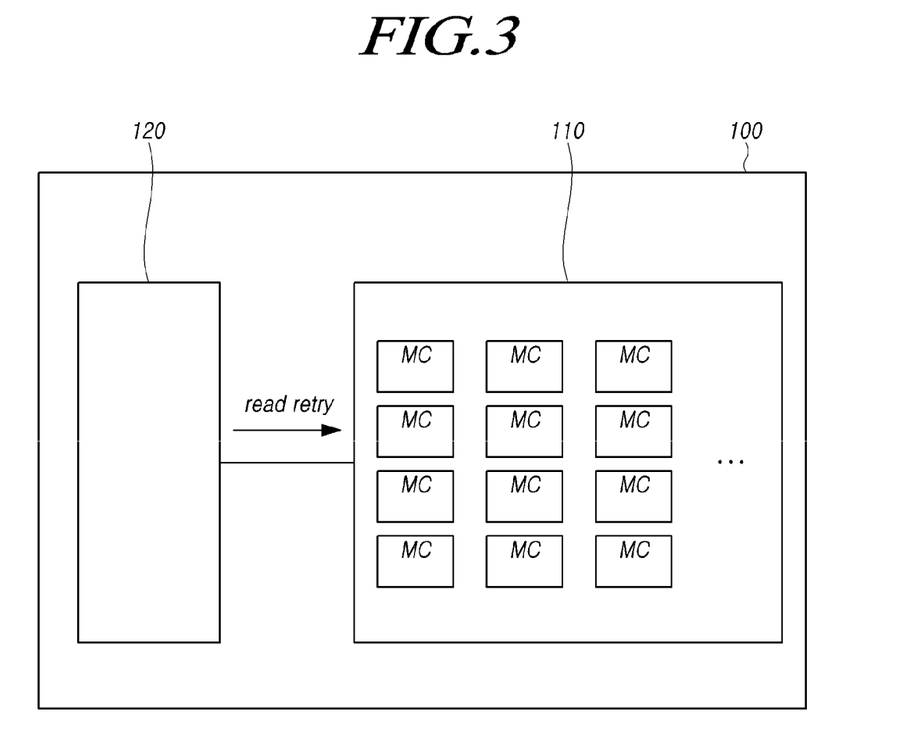
FIG. 3 illustrates a storage device according to an embodiment of the present disclosure.

FIG. 3 illustrates a storage device 100 according to an embodiment of the present disclosure.

Referring to FIG. 3, the storage device 100 may include a memory 110 and a controller 120.

The memory 110 may include a plurality of memory cells MC. The plurality of memory cells MC may be included in the memory cell array described above with reference to FIG. 2. The plurality of memory cells MC may have a distribution of programmed threshold voltages corresponding to bit values of data stored therein. The distribution of programmed threshold voltages of the plurality of memory cells MC may change after a program operation is completed on the plurality of memory cells MC, and thus, a failure may occur during a read operation on the plurality of memory cells MC.

When a failure occurs during the read operation on the plurality of memory cells MC, the controller 120 may execute a read retry operation on the plurality of memory cells MC to perform the read operation on the plurality of memory cells MC again. Hereinafter, this will be described in detail with reference to FIG. 4.

Figure 4:
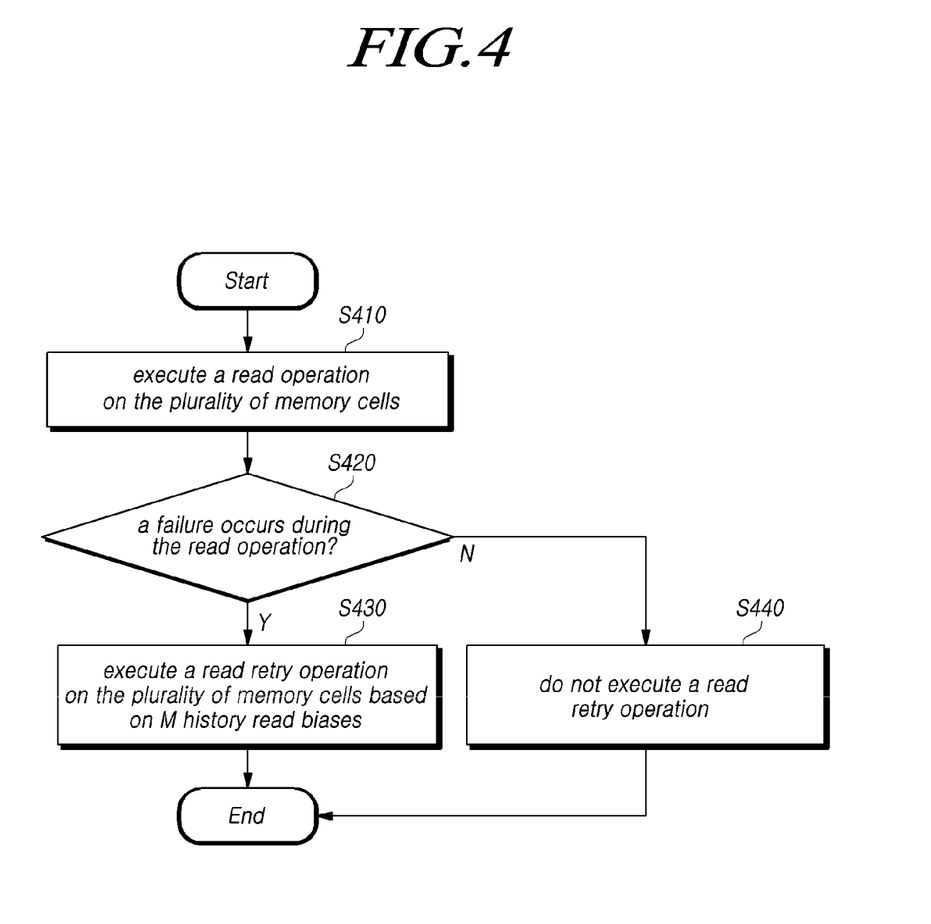
FIG. 4 illustrates an operation of a storage device according to an embodiment of the present disclosure.

FIG. 4 illustrates an operation of a storage device according to an embodiment of the present disclosure.

Referring to FIGS. 3 and 4, the controller 120 of the storage device 100 may execute the read operation on the plurality of memory cells MC (S410).

The controller 120 may determine whether a failure occurs during the read operation on the plurality of memory cells MC (S420). For example, when the number of error bits in data read from the plurality of memory cells MC is greater than or equal to a threshold value, the controller 120 may determine that a failure has occurred.

When it is determined that a failure has occurred during the read operation on the plurality of memory cells MC (S420-Y), the controller 120 may execute a read retry operation on the plurality of memory cells MC based on M history read biases (M is a natural number equal to or greater than 2) (S430).

When executing the read retry operation on the plurality of memory cells MC, the controller 120 may select one of the M history read biases according to a designated sequence, and may execute a read operation on the plurality of memory cells MC based on the selected history read bias. The controller 120 may repeat the operation of selecting one of the M history read biases according to the designated sequence until the read operation on the plurality of memory cells MC succeeds.

When the read operation on the plurality of memory cells MC succeeds based on the selected history read bias, the controller 120 may terminate the read retry operation.

For example, the M history read biases may refer to read biases used in previously executed read operations on the plurality of memory cells MC.

Meanwhile, the controller 120 may store the M history read biases in a specific data structure (e.g., table, array, or the like). The M history read biases may be stored in the specific data structure, and the controller 120 may access the M history read biases using indexes respectively corresponding to the M history read biases. One history read bias may correspond to one unique index.

In an embodiment of the present disclosure, the M history read biases may correspond to indexes 1 to M, respectively. However, values of the indexes corresponding to the M history read biases are not limited thereto, and the values of the indexes may be determined differently. For example, the M history read biases may correspond to indexes 0 to M−1, respectively.

On the other hand, when it is determined that a failure has not occurred during the read operation on the plurality of memory cells MC (S420-N), the controller 120 may not execute the read retry operation on the plurality of memory cells (S440).

In the embodiment of the present disclosure, when the read retry operation on the plurality of memory cells MC is executed in operation S430, the controller 120 may determine a first sequence, which is a sequence of the M history read biases applied during the read retry operation, based on a read retry sequence key. For example, the controller 120 may derive the first sequence by parsing the read retry sequence key according to a predetermined rule. Through this, the controller 120 may reduce a storage space required to store the first sequence by expressing the first sequence as one key value.

Hereinafter, it will be explained in detail with reference to FIG. 5.

Figure 5:
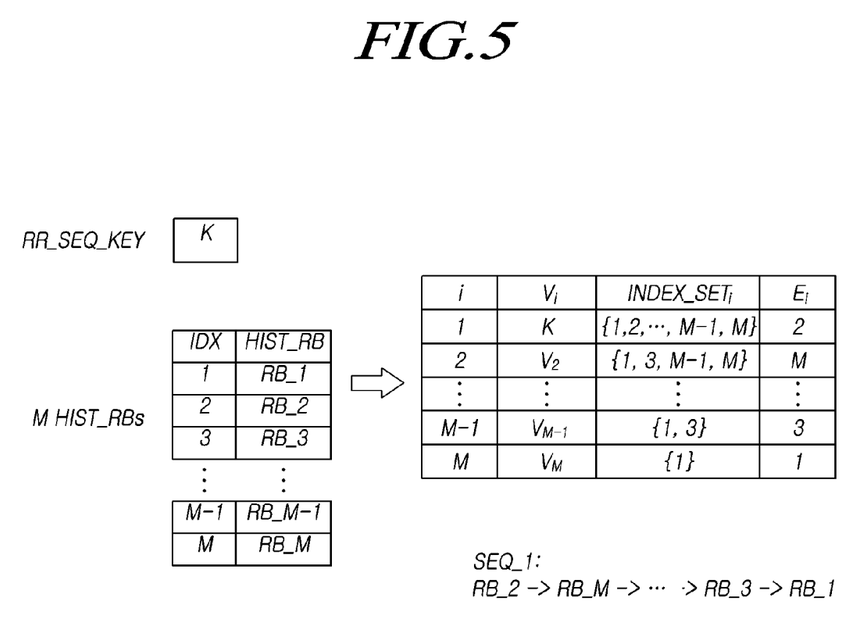
FIG. 5 illustrates an operation in which a storage device determines a first sequence according to an embodiment of the present disclosure.

FIG. 5 illustrates an operation in which a storage device determines a first sequence according to an embodiment of the present disclosure.

Referring to FIG. 5, a value of a read retry sequence key RR_SEQ_KEY is K.

Values of M history read biases HIST_RB are RB_1, RB_2, RB_3, . . . , RB_M-1, and RB_M, and they correspond to indexes IDX 1, 2, 3, . . . , M-1, and M, respectively.

Referring to FIGS. 3 and 5, the controller 120 of the storage device 100 may determine an index $E_i$ corresponding to an i-th history read bias in the first sequence SEQ_1, i being a natural number less than or equal to M. The index $E_i$ may be used to search for the i-th history read bias among the M history read biases HIST_RB during the read retry operation.

The controller 120 may determine the index $E_i$ based on i) a sequence value $V_i$ corresponding to i and ii) INDEX_SET$_i$ which is a set of indexes of history read biases HIST_RB corresponding to i. The $V_i$ may be a specific value, and the INDEX_SET$_i$ may be a set having, as elements, one or more of M indexes respectively corresponding to the M history read biases.

The controller 120 may determine $V_1$ as the value K of the read retry sequence key RR_SEQ_KEY. And the controller 120 may determine INDEX_SET$_1$ as a set of M indexes respectively corresponding to the M history read biases HIST_RB. In FIG. 5, the M indexes respectively corresponding to the M history read biases HIST_RB are 1, 2, . . . , M-1, and M, so that the controller 120 may set the INDEX_SET$_1$ to $\{1, 2, \ldots , M-1, M\}$.

The controller 120 may determine $E_1$ based on the $V_1$ and the INDEX_SET$_1$. In FIG. 5, the $E_1$ is 2. Therefore, a history read bias applied first during the read retry operation becomes the $2^{nd}$ history read bias RB_2, which is a history read bias corresponding to the index 2.

When i is less than M, the controller 120 may determine a sequence value $V_{i+1}$ corresponding to an index (i+1) based on the $V_i$, and determine INDEX_SET$_{i+1}$, which is a set of indexes of history read biases corresponding to the index (i+1), based on the INDEX_SET$_i$ and the $E_i$.

Accordingly, in FIG. 5, the controller 120 may determine $V_2$ based on $V_1$=K, and determine INDEX_SET$_2$ based on the INDEX_SET$_1$=$\{1, 2, \ldots , M-1, M\}$ and the $E_1$=2. And the controller 120 may determine $E_2$ as M based on the $V_2$ and the INDEX_SET$_2$.

In the same way, the controller 120 may determine $V_M$ based on $V_{M-1}$=K, and determine INDEX_SET$_M$ based on INDEX_SET$_{M-1}$=$\{1, 3\}$ and $E_{M-1}$=3. And the controller 120 may determine $E_M$ as 1 based on the $V_M$ and INDEX_SET$_M$.

In FIG. 5, $E_1$=2, $E_2$=M, . . . , $E_{M-1}$=3, and $E_M$=1. Therefore, the first sequence SEQ_1 is determined as RB_2→RB_M→ . . . →RB_3→RB_1.

Hereinafter, embodiments of the content described in FIG. 5 will be described.

For example, the controller 120 may determine the aforementioned $E_i$ using Equation 1 below.

$$E_i = \text{INDEX\_SET}_i[(V_i/((M-i)!))+1] \quad \text{[Equation 1]}$$

In this case, INDEX_SET$_i$[($V_i$/((M-i)!))+1] is a (($V_i$/((M-i)!))+1)-th index among the indexes included in the INDEX_SET$_i$, ($V_i$/((M-i)!)) is a quotient of $V_i$ divided by ((M-i)!).

The controller 120 may determine, after determining the $E_i$, the $V_{i+1}$ and the INDEX_SET$_{i+1}$ using Equation 2 below.

$$V_{i+1} = (V_i \% ((M-i)!))$$

$$\text{INDEX\_SET}_{i+1} = \text{INDEX\_SET}_i - \{E_i\}, \quad \text{[Equation 2]}$$

wherein ($V_i$% ((M-i)!)) is a remainder of dividing $V_i$ by ((M-i)!),

INDEX_SET$_i$-$\{E_i\}$ is subtraction of INDEX_SET$_i$ and $\{E_i\}$.

Hereinafter, a method for the controller 120 to determine the first sequence SEQ_1 by applying Equations 1 and 2 will be described based on a specific example shown in FIG. 6.

Figure 6:
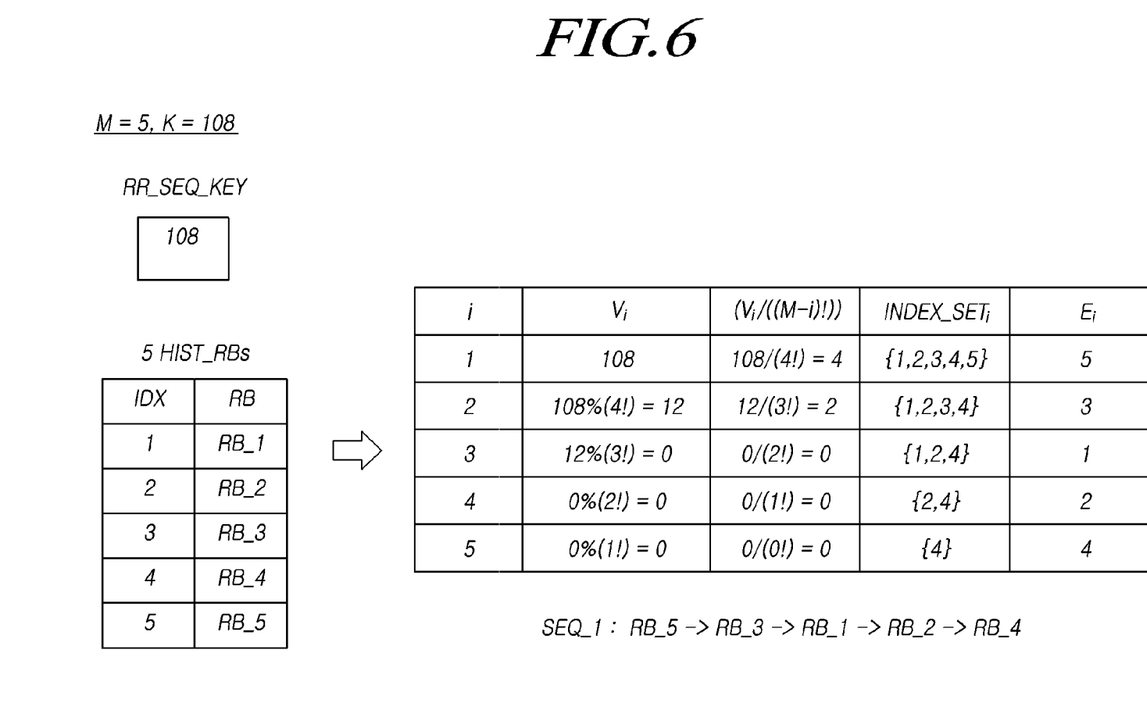
FIG. 6 illustrates a storage device determining a first sequence according to an embodiment of the present disclosure.

FIG. 6 illustrates a storage device determining a first sequence according to an embodiment of the present disclosure.

In FIG. 6, the value K of the read retry sequence key RR_SEQ_KEY is 108, and the number M of the history read biases HIST_RB is 5. Indexes IDX corresponding to the 5 history read biases RB_1, RB_2, RB_3, RB_4, and RB_5 are 1, 2, 3, 4, and 5, respectively.

First, the controller 120 of the storage device 100 may determine $V_1$ as 108, which is the value of the read retry sequence key RR_SEQ_KEY. The controller 120 may determine INDEX_SET$_1$ as $\{1, 2, 3, 4, 5\}$.

At this time, the controller 120 may apply Equation 1 to determine $E_1$. That is, $E_1$=INDEX_SET$_1$ [($V_1$/((M-1)!))+1]=INDEX_SET$_1$[(108/(4!))+1]=INDEX_SET$_1$[5]=5.

After $E_1$ is determined as 5, the controller 120 may apply Equation 2 to determine $V_2$ and INDEX_SET$_2$. That is, $V_2$=($V_1$% ((M-1)!))=(108% (4!))=12, and INDEX_SET$_2$=INDEX_SET$_1$-$\{E_1\}$=$\{1,2,3,4,5\}$-$\{5\}$=$\{1,2,3,4\}$.

The controller 120 may determine $E_2$, $E_3$, $E_4$, and $E_5$ by applying Equations 1 and 2 in the same way.

When i is 2, the controller 120 may apply Equation 1 to determine $E_2$=INDEX_SET$_2$ [($V_2$/((M-2)!))+1]= INDEX_SET$_2$[(12/(3!))+1]=INDEX_SET$_2$[3]=3.

After $E_2$ is determined as 3, the controller 120 may apply Equation 2 to determine $V_3$ and INDEX_SET$_3$. That is, $V_3$=($V_2$% ((M-2)!))=(12% (3!))=0, and INDEX_SET$_3$=INDEX_SET$_2$-$\{E_2\}$=$\{1,2,3,4\}$-$\{3\}$=$\{1,2,4\}$.

When i is 3, the controller 120 may apply Equation 1 to determine $E_3$. That is, $E_3$=INDEX_SET$_3$[($V_3$/ ((M-3)!))+1]=INDEX_SET$_3$[(0/(2!))+1]=INDEX_SET$_3$[1]=1.

After $E_3$ is determined as 1, the controller 120 may apply Equation 2 to determine $V_4$ and INDEX_SET$_4$. That is, $V_4$=($V_3$% ((M-3)!))=(0% (2!))=0, and INDEX_SET$_4$=INDEX_SET$_3$-$\{E_3\}$=$\{1,2,4\}$-$\{1\}$=$\{2,4\}$.

When i=4, the controller 120 may apply Equation 1 to determine $E_4$. That is, $E_4$=INDEX_SET$_4$[($V_4$/ ((M-4)!))+1]=INDEX_SET$_4$[(0/(1!))+1]=INDEX_SET$_4$[1]=2.

After $E_4$ is determined as 2, the controller 120 may apply Equation 2 to determine $V_5$ and INDEX_SET$_5$. That is, $V_5$=($V_4$% ((M-4)!))=(0% (1!))=0, and INDEX_SET$_5$=INDEX_SET$_4$-$\{E_4\}$=$\{2, 4\}$-$\{2\}$=$\{4\}$.

When i is 5, the controller 120 may apply Equation 1 to determine $E_5$. That is, $E_5$=INDEX_SET$_5$[($V_5$/ ((M-5)!))+1]=INDEX_SET$_5$[(0/(0!))+1]=INDEX_SET$_5$[1]=4.

In FIG. 6, it is determined that $E_1$=5, $E_2$=3, $E_3$=1, $E_4$=2, $E_5$=4. Accordingly, the first sequence SEQ_1 may be determined as RB_5→RB_3→RB_1→RB_2→RB_4.

In the above, the operation in which the storage device 100 determines the first sequence SEQ_1 based on the read retry sequence key RR_SEQ_KEY has been described.

Meanwhile, the storage device 100 may change a sequence of applying the M history read biases HIST_RB based on a result of executing a read retry operation on the plurality of memory cells MC.

For example, the controller 120 of the storage device 100 may successfully perform a read retry operation based on a target history read bias which is a history read bias located at a T-th position in the first sequence SEQ_1 (T is a natural number less than or equal to M). When the number of error bits generated in data that is read from the plurality of memory cells MC based on the target history read bias is less than a threshold value, the controller 120 may determine that the read retry operation has been successfully performed based on the target history read bias.

At this time, the controller 120 may determine a second sequence of applying the M history read biases HIST_RB in a subsequent read retry operation.

The controller 120 may determine the second sequence so that the target history read bias is located first in the second sequence.

In order to determine the second sequence, the controller 120 may change the sequence of history read biases among the M history read biases HIST_RB, excluding the target history read bias, in the first sequence SEQ_1.

For example, the controller 120 may determine the second sequence such that an X-th history read bias in the first sequence SEQ_1 (X is a natural number less than T) is located at an (X+1)-th position in the second sequence.

The controller 120 may change the value of the read retry sequence key RR_SEQ_KEY based on the second sequence.

Hereinafter, a specific embodiment thereof will be described with reference to FIG. 7.

Figure 7:
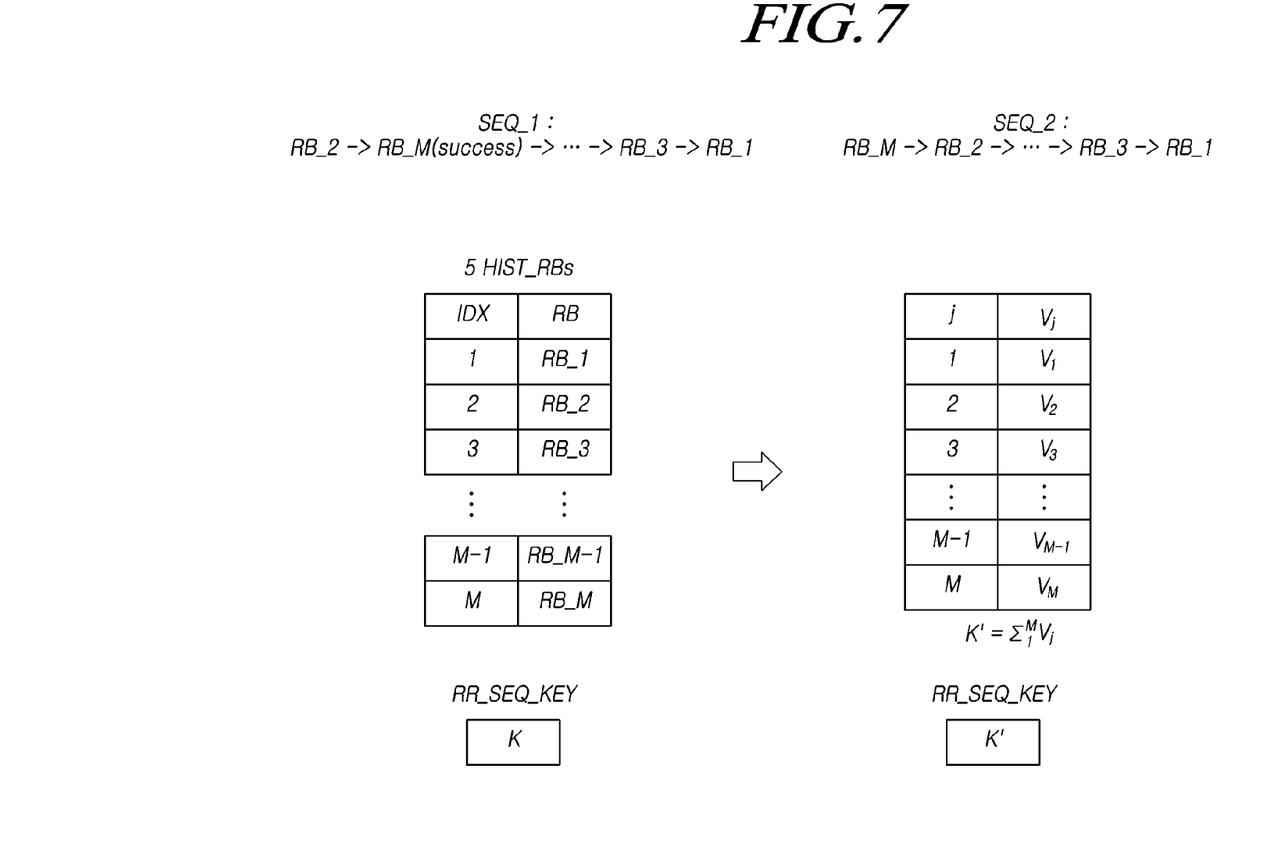
FIG. 7 illustrates an operation in which a storage device changes a read retry sequence key according to an embodiment of the present disclosure.

FIG. 7 illustrates an operation in which a storage device changes a read retry sequence key according to an embodiment of the present disclosure.

Referring to FIGS. 3 and 7, the controller 120 of the storage device 100 may execute the read retry operation on the plurality of memory cells MC according to the first sequence SEQ_1, which is RB_2→RB_M→ . . . →RB_3→RB_1. At this time, the value of the read retry sequence key RR_SEQ_KEY corresponding to the first sequence SEQ_1 is K.

In FIG. 7, the controller 120 may successfully perform the read retry operation by applying a second read bias RB_M among the M history read biases HIST_RB in the first sequence SEQ_1.

The controller 120 may determine the second sequence SEQ_2 so that RB_M is located first, and RB_1, which is located first in the first sequence SEQ_1, is located second in the second sequence SEQ_2. Therefore, the second sequence SEQ_2 is determined as RB_M→RB_2→ . . . →RB_3→RB_1.

Meanwhile, the controller 120 may change the value of the read retry sequence key RR_SEQ_KEY according to the second sequence SEQ_2.

In FIG. 7, the controller 120 may change the value of the read retry sequence key RR_SEQ_KEY based on a sequence value $V_j$ corresponding to j (j is a natural number less than or equal to M), using Equation 3 below.

$$K' = \Sum_1^M V_j,$$ [Equation 3]

wherein K' is a changed value of the read retry sequence key RR_SEQ_KEY.

In this case, the controller 120 may change $V_j$ based on the second sequence SEQ_2.

For example, the controller 120 may determine the $V_j$ using Equation 4 below.

$$V_j = ((M-j)!)*(N_j)$$ [Equation 4]

The controller 120 may determine the $N_j$ as the number of indexes less than $E_j$ among indexes included in INDEX_SET$_j$ which is a set of indexes of history read biases corresponding to j. The $E_j$ is an index of a history read bias located at a j-th position in the second sequence SEQ_2.

The controller 120 may determine INDEX_SET$_1$ as a set of M indexes respectively corresponding to the M history read biases. That is, in FIG. 7, the controller 120 may determine INDEX_SET$_1$={1, 2, 3, . . . , M−1, M}.

When j is less than M, the controller 120 may determine INDEX_SET$_{j+1}$, which is a set of indexes of history read biases corresponding to (j+1), using Equation 5 below.

$$\text{INDEX\_SET}_{j+1} = \text{INDEX\_SET}_j - \{E_j\}$$ [Equation 5]

Hereinafter, a detailed example will be described with reference to FIG. 8.

Figure 8:
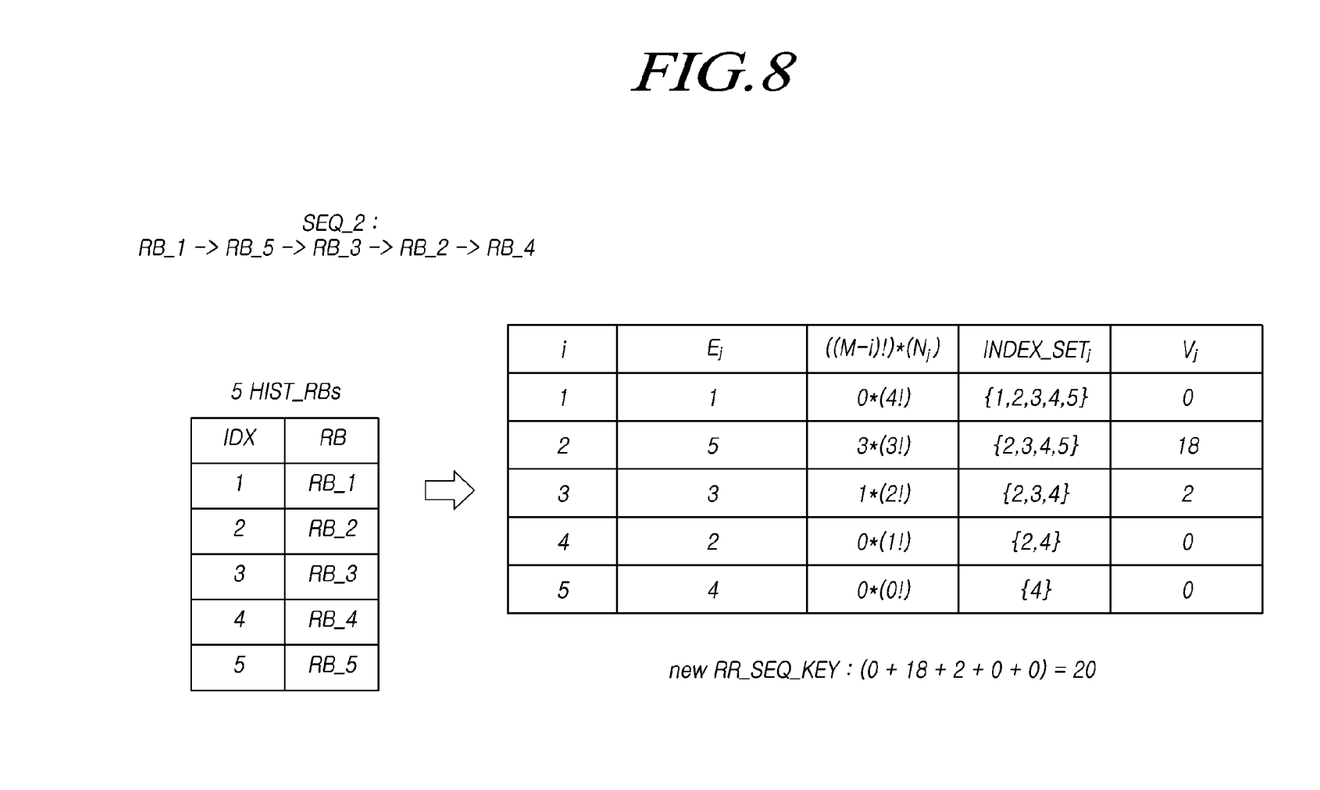
FIG. 8 illustrates a storage device changing a read retry sequence key based on a second sequence according to an embodiment of the present disclosure.

FIG. 8 illustrates an example of a storage device changing a read retry sequence key based on a second sequence according to an embodiment of the present disclosure.

In FIG. 8, the number M of history read biases HIST_RB is 5. Indexes corresponding to the 5 history read biases HIST_RB (RB_1, RB_2, RB_3, RB_4, and RB_5) are 1, 2, 3, 4, and 5, respectively. The second sequence SEQ_2 is RB_1→RB_5→RB_3→RB_2→RB_4.

First, when j is 1, $N_1$ may be determined as the number of indexes smaller than $E_1$=1, which is an index of the history read bias RB_1 located first in the second sequence SEQ_2 among indexes included in INDEX_SET$_1$={1,2,3,4,5}. $N_1$ is determined as 0 because there is no index smaller than 1 in INDEX_SET$_1$.

Accordingly, the controller 120 may determine $V_1$ as $((5-1)!)*(N_1)=(4!)*(0)=0$.

After determining the $V_1$, the controller 120 may determine INDEX_SET$_2$ as INDEX_SET$_1$−{E$_1$}={1,2,3,4,5}−{1}={2,3,4,5}.

When j=2, $N_2$ may be determined as the number of indexes smaller than $E_2$=5, which is an index of history read bias RB_5 located at a second position in the second sequence SEQ_2 among indexes included in INDEX_SET$_2$={2,3,4,5}. $N_2$ is determined as 3 because there are three indexes, i.e., 2, 3, and 4, which are smaller than 5, in INDEX_SET$_2$.

Accordingly, the controller 120 may determine $V_2$ as $((5-2)!)*(N_2)=(3!)*(3)=18$.

After determining the $V_2$, the controller 120 may determine INDEX_SET$_3$ as INDEX_SET$_2$−{E$_2$}={2,3,4,5}−{5}={2,3,4}.

When j=3, $N_3$ may be determined as the number of indexes smaller than $E_3$=3, which is an index of history read bias RB_3 located at a third position in the second sequence SEQ_2 among indexes included in INDEX_SET$_3$={2,3,4}. $N_3$ is determined as 1 because there is one index, i.e., 2, which is smaller than 3, in INDEX_SET$_3$.

Accordingly, the controller 120 may determine $V_3$ as $((5-3)!)*(N_3)=(2!)*(1)=2$.

After determining the $V_3$, the controller 120 may determine INDEX_SET$_4$ as INDEX_SET$_3$−{E$_3$}={2,3,4}−{3}={2,4}.

When j=4, $N_4$ may be determined as the number of indexes smaller than $E_4$=2, which is an index of history read bias RB_2 located at a fourth position in the second sequence SEQ_2 among indexes included in INDEX_SET$_4$={2,4}. N$_4$ is determined as 0 because there is no index that is smaller than 2 in INDEX_SET$_4$.

Accordingly, the controller 120 may determine V$_4$ as $((5-4)!)*(N_4)=(1!)*(0)=0$.

After determining the V$_4$, the controller 120 may determine INDEX_SET$_5$ as INDEX_SET$_4$-{E$_4$}={2,4}-{2}={4}.

When j=5, N$_5$ may be determined as the number of indexes smaller than E$_5$=4, which is an index of history read bias RB_4 located at a fifth position in the second sequence SEQ_2 among index include in INDEX_SET$_5$={4}. N$_5$ is determined as 0 because there is no index smaller than 4 in INDEX_SET$_5$.

Accordingly, the controller 120 may determine V$_5$ as $((5-5)!)*(N_5)=(0!)*(0)=0$.

Figure 9:
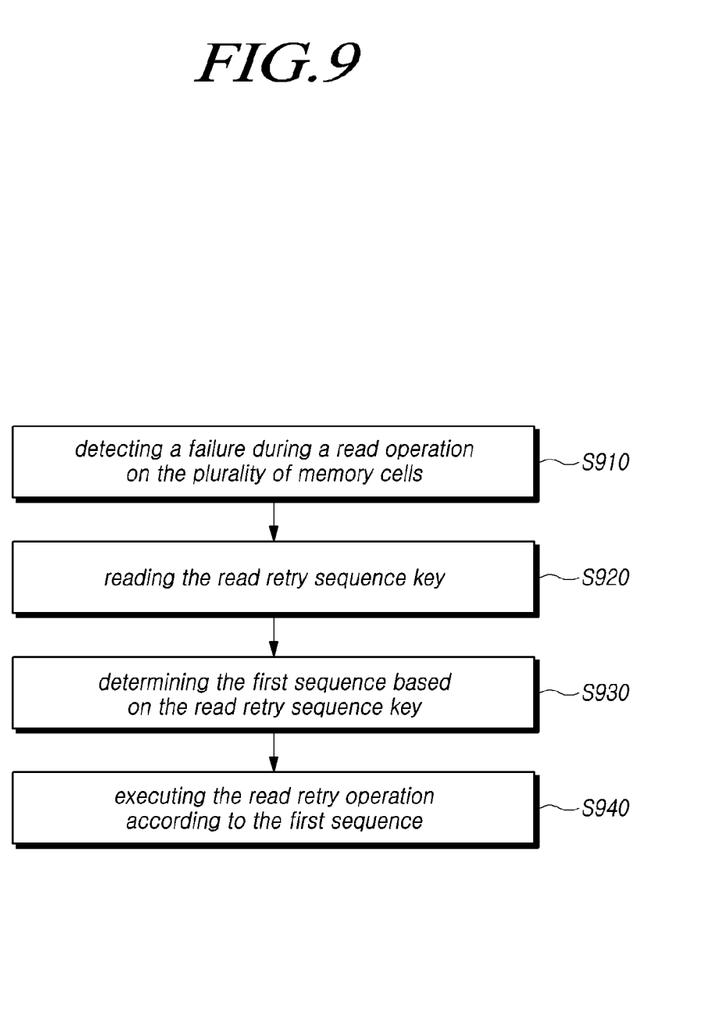
FIG. 9 illustrates an operating method of a storage device according to an embodiment of the present disclosure.

FIG. 9 illustrates an operating method of a storage device according to an embodiment of the present disclosure.

Referring to FIGS. 3 and 9, the storage device 100 may detect a failure during a read operation on the plurality of memory cells MC (S910).

The storage device 100 may read the read retry sequence key RR_SEQ_KEY (S920).

The storage device 100 may determine the first sequence SEQ_1 based on the read retry sequence key RR_SEQ_KEY (S930). The first sequence is a sequence of M history read biases HIST_RB applied when the read retry operation is performed on the plurality of memory cells MC.

In this case, the operation S930 may include determining an index E$_i$ corresponding to an i-th (i is a natural number less than or equal to M) history read bias in the first sequence SEQ_1 based on 1) a sequence value V$_i$ corresponding to i and 2) INDEX_SET$_i$ which is a set of indexes of history read biases corresponding to i. The operation S930 may further include determining, when i is less than M, a sequence value V$_{i+1}$ corresponding to (i+1) based on the V$_i$, and INDEX_SET$_{i+1}$ which is a set of indexes of history read biases corresponding to (i+1) based on the INDEX_SET$_{i+1}$ and the E$_j$. The operation S930 may still further include determining V$_1$ as the read retry sequence key RR_SEQ_KEY, and determining INDEX_SET$_1$ as a set of M indexes respectively corresponding to the M history read biases.

For example, the determining of the first sequence SEQ_1 may determine the E$_i$ using Equation 1 below.

$$E_i = \text{INDEX\_SET}_i[(V_i/((M-i)!))+1] \qquad [\text{Equation 1}]$$

The determining of the first sequence SEQ_1 may determine, after determining the E$_i$, the V$_{i+1}$ and the INDEX_SET$_{i+1}$ using Equation 2 below.

$$V_{i+1} = (V_i \% ((M-i)!))$$

$$\text{INDEX\_SET}_{i+1} = \text{INDEX\_SET}_i - \{E_i\} \qquad [\text{Equation 2}]$$

After determining the first sequence SEQ_1, the storage device 100 may execute the read retry operation according to the first sequence SEQ_1 (S940).

In this case, the operation S940 may include i) succeeding the read retry operation based on a target history read bias which is a history read bias located at a T-th position in the first sequence SEQ_1, ii) determining a second sequence SEQ_2 which is an sequence of the M history read biases applied in a subsequent read retry operation, and iii) changing the read retry sequence key RR_SEQ_KEY based on the second sequence SEQ_2.

In this case, the determining of the second sequence SEQ_2 may determine the second sequence SEQ_2 so that the target history read bias is located first in the second sequence SEQ_2. Additionally, the determining of the second sequence SEQ_2 may determine the second sequence SEQ_2 such that an X-th (X is a natural number less than T) history read bias in the first sequence SEQ_1 is to be located at an (X+1)-th position in the second sequence SEQ_2.

The changing of the read retry sequence key RR_SEQ_KEY based on the second sequence SEQ_2 may change the read retry sequence key RR_SEQ_KEY based on a sequence value V$_j$ corresponding to j, using Equation 3 below.

$$K' = \Sigma_1^M V_j, \qquad [\text{Equation 3}]$$

wherein K' is a changed value of the read retry sequence key RR_SEQ_KEY.

In this case, the V$_j$ may be determined based on the second sequence SEQ_2.

For example, the changing of the read retry sequence key RR_SEQ_KEY may determine the V$_j$ using Equation 4 below.

$$V_j = ((M-j)!)*(N_j) \qquad [\text{Equation 4}]$$

The N$_j$ may be determined as the number of indexes less than E$_j$, which is an index of a history read bias located at a j-th position in the second sequence SEQ_2 among indexes included in INDEX_SET$_j$ which is a set of indexes of history read biases corresponding to j.

The INDEX_SET$_1$ may be determined as a set of M indexes respectively corresponding to the M history read biases.

When j is less than M, INDEX_SET$_{j+1}$, which is a set of indexes of history read biases corresponding to (j+1), may be determined using Equation 5 below.

$$\text{INDEX\_SET}_{j+1} = \text{INDEX\_SET}_j - \{E_j\} \qquad [\text{Equation}]$$

Although the embodiments of the present disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted in connection with the appended claims and encompass all equivalents falling within the scope of the appended claims.

What is claimed is:

1. A storage device comprising:
    a memory including a plurality of memory cells; and
    a controller configured to perform a read retry operation on the plurality of memory cells when a failure occurs during a read operation on the plurality of memory cells;
    wherein the controller is configured to:
    perform the read retry operation based on M history read biases, and
    determine a first sequence in which the M history read biases are applied when the read retry operation is performed, based on a read retry sequence key,
    wherein M is a natural number greater than or equal to 2.

2. The storage device according to claim 1, wherein the controller is configured to:
    determine an index E$_i$ corresponding to an i-th history read bias in the first sequence based on 1) a sequence value $V_i$ corresponding to i and 2) INDEX_SET$_i$ that is a set of indexes of history read biases corresponding to i, when i is less than M, determine a sequence value $V_{i+1}$ corresponding to (i+1) based on the $V_i$, and determine INDEX_SET$_{i+1}$ that is a set of indexes of history read biases corresponding to (i+1) based on the INDEX_SET$_{i+1}$ and the $E_i$, determine $V_1$ as the read retry sequence key, and determine INDEX_SET$_1$ as a set of M indexes respectively corresponding to the M history read biases, wherein i is a natural number less than or equal to M.

3. The storage device according to claim 2, wherein the controller is configured to:

determine the $E_i$ as follows:

$$E_i = \text{INDEX\_SET}_i[(V_i/((M-i)!))+1]; \text{ and}$$

determine, after determining the $E_i$, the $V_{i+1}$ and the INDEX_SET$_{i+1}$ as follows:

$$V_{i+1} = (V_i\%((M-i)!)), \text{ and}$$

$$\text{INDEX\_SET}_{i+1} = \text{INDEX\_SET}_i - \{E_i\}.$$

4. The storage device according to claim 1, wherein the controller is configured to:

determine, when the read retry operation is successfully performed based on a target history read bias that is a history read bias located at a T-th position in the first sequence, a second sequence that is a sequence of applying the M history read biases in a subsequent read retry operation, wherein the second sequence is determined so that the target history read bias is located first in the second sequence, and change the read retry sequence key based on the second sequence, wherein T is a natural number less than or equal to M.

5. The storage device according to claim 4, wherein the controller is configured to:

determine the second sequence such that an X-th history read bias in the first sequence is located at an (X+1)-th position in the second sequence, wherein X is a natural number less than T.

6. The storage device according to claim 4, wherein the controller is configured to:

change the read retry sequence key based on a sequence value $V_j$ corresponding to j as follows:

$$K' = \Sigma_1^M V_j,$$

wherein K' is a changed read retry sequency key; and determine the $V_j$ based on the second sequence, wherein j is a natural number less than or equal to M.

7. The storage device according to claim 6, wherein the controller is configured to:

determine the $V_j$ as follows:

$$V_j = ((M-j)!)*(N_j);$$

determine the $N_j$ as a number of indexes less than $E_j$, wherein the $E_j$ is an index of a history read bias located at a j-th position in the second sequence, among indexes included in INDEX_SET$_j$ which is a set of indexes of history read biases corresponding to j;

determine INDEX_SET$_1$ as a set of M indexes respectively corresponding to the M history read biases; and determine, when j is less than M, INDEX_SET$_{j+1}$, which is a set of indexes of history read biases corresponding to (j+1), as follows:

$$\text{INDEX\_SET}_{j+1} = \text{INDEX\_SET}_j - \{E_j\}.$$

8. A method for operating a storage device, the method comprising:

detecting a failure that occurs during a read operation on a plurality of memory cells;

reading a read retry sequence key;

determining a first sequence, in which M history read biases are applied when a read retry operation is performed on the plurality of memory cells, based on the read retry sequence key; and performing the read retry operation according to the first sequence;

wherein M is a natural number greater than or equal to 2.

9. The method according to claim 8, wherein the determining of the first sequence comprises:

determining an index $E_i$ corresponding to an i-th history read bias in the first sequence based on 1) a sequence value $V_i$ corresponding to i and 2) INDEX_SET$_i$ that is a set of indexes of history read biases corresponding to i, when i is less than M, determine a sequence value $V_{i+1}$ corresponding to (i+1) based on the $V_i$, and determine INDEX_SET$_{i+1}$ that is a set of indexes of history read biases corresponding to (i+1) based on the INDEX_SET$_{i+1}$ and the $E_i$, determining $V_1$ as the read retry sequence key, and determining INDEX_SET$_1$ as a set of M indexes respectively corresponding to the M history read biases, wherein i is a natural number less than or equal to M.

10. The method according to claim 9, wherein the determining of the first sequence comprises:

determining the $E_i$ as follows:

$$E_i = \text{INDEX\_SET}_i[(V_i/((M-i)!))+1]; \text{ and}$$

determining, after determining the $E_i$, the $V_{i+1}$ and the INDEX_SET$_{i+1}$ as follows:

$$V_{i+1} = (V_i\%((M-i)!)), \text{ and}$$

$$\text{INDEX\_SET}_{i+1} = \text{INDEX\_SET}_i - \{E_i\}.$$

11. The method according to claim 8, wherein the performing of the read retry operation comprises:

succeeding the read retry operation based on a target history read bias that is a history read bias located at a T-th position in the first sequence;

determining a second sequence that is a sequence of applying the M history read biases in a subsequent read retry operation; and changing the read retry sequence key based on the second sequence;

wherein the determining of the second sequence includes determining the second sequence so that the target history read bias is located first in the second sequence, and wherein T is a natural number less than or equal to M.

12. The method according to claim 11, wherein the determining of the second sequence includes determining the second sequence such that an X-th history read bias in the first sequence is located at an (X+1)-th position in the second sequence, wherein X is a natural number less than T.

13. The method according to claim 11, wherein the changing of the read retry sequence key includes changing the read retry sequence key based on a sequence value $V_j$ corresponding to j as follows:

$$K'=\Sigma_1^M V_j,$$

wherein K' is a changed read retry sequency key,
  wherein the $V_j$ is determined based on the second sequence, and
  wherein j is a natural number less than or equal to M.

14. The method according to claim 13, wherein the changing of the read retry sequence key includes determining the $V_j$ as follows:

$$V_j=((M-j)!)*(N_j),$$

wherein the $N_j$ is determined as a number of indexes less than $E_j$, wherein the $E_j$ is an index of a history read bias located at a j-th position in the second sequence among indexes included in $INDEX\_SET_j$ which is a set of indexes of history read biases corresponding to j, wherein $INDEX\_SET_1$ is determined as a set of M indexes respectively corresponding to the M history read biases, and wherein when j is less than M, $INDEX\_SET_{j+1}$, which is a set of indexes of history read biases corresponding to (j+1), is determined as follows:

$$INDEX\_SET_{j+1}=INDEX\_SET_j-\{E_j\}.$$

* * * * *